United States Patent
Li et al.

(10) Patent No.: US 11,973,248 B2
(45) Date of Patent: Apr. 30, 2024

(54) METHOD FOR DIAGNOSING DEGRADATION OF FUEL CELL STACK, METHOD FOR MULTI-POINT ANALYSIS OF FUEL CELL, AND METHOD FOR ESTIMATING PERFORMANCE OF FUEL CELL MEMBRANE ELECTRODE

(71) Applicant: TSINGHUA UNIVERSITY, Beijing (CN)

(72) Inventors: Jian-Qiu Li, Beijing (CN); Zun-Yan Hu, Beijing (CN); Liang-Fei Xu, Beijing (CN); Ming-Gao Ouyang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 390 days.

(21) Appl. No.: 17/339,948

(22) Filed: Jun. 5, 2021

(65) Prior Publication Data
US 2021/0296668 A1  Sep. 23, 2021

Related U.S. Application Data

(63) Continuation of application No. PCT/CN2019/129122, filed on Dec. 27, 2019.

(30) Foreign Application Priority Data

Dec. 29, 2018 (CN) .......................... 201811640094.3
Dec. 29, 2018 (CN) .......................... 201811640164.5
Dec. 29, 2018 (CN) .......................... 201811645164.4

(51) Int. Cl.
*H01M 8/04* (2016.01)
*G01R 31/392* (2019.01)
(Continued)

(52) U.S. Cl.
CPC ...... *H01M 8/04679* (2013.01); *G01R 31/392* (2019.01); *H01M 8/04559* (2013.01); *H01M 8/04589* (2013.01)

(58) Field of Classification Search
CPC ......... H01M 8/04679; H01M 8/04559; H01M 8/04589
See application file for complete search history.

(56) References Cited

U.S. PATENT DOCUMENTS

2008/0076012 A1\* 3/2008 Lienkamp ......... H01M 8/04992
429/65

FOREIGN PATENT DOCUMENTS

| CN | 101324641 | 12/2008 |
|---|---|---|
| CN | 101855763 | 10/2010 |

(Continued)

OTHER PUBLICATIONS

International Search Report of PCT/CN2019/129122.

*Primary Examiner* — Olatunji A Godo

(57) ABSTRACT

A method for diagnosing degradation of a fuel cell stack, including: S10, qualitatively determining a degradation type of the fuel cell stack according to a voltage-current curve of the fuel cell stack; S20, quantitatively measuring parameter values of each of individual cells of the fuel cell stack according to the degradation type, and quantitatively determining a degradation degree of each of the individual cells according to the parameter values; S30, determining a uniformity degradation degree among the individual cells of the fuel cell stack according to a non-uniformity degree of a voltage distribution of the individual cells. By qualitatively determining the degradation type of the fuel cell stack, the degradation condition of the entire fuel cell stack may be obtained.

13 Claims, 10 Drawing Sheets

(51) Int. Cl.
   *H01M 8/04537*   (2016.01)
   *H01M 8/04664*   (2016.01)

(56) References Cited

FOREIGN PATENT DOCUMENTS

| | | |
|---|---|---|
| CN | 101933186 | 12/2010 |
| CN | 102981124 | 3/2013 |
| CN | 104360277 | 2/2015 |
| CN | 104937759 | 9/2015 |
| CN | 105702985 | 6/2016 |
| CN | 106816611 | 6/2017 |
| CN | 107656215 | 2/2018 |
| CN | 207624812 | 7/2018 |
| CN | 109669135 | 4/2019 |
| CN | 109799465 | 5/2019 |
| CN | 109802160 | 5/2019 |
| DE | 102014013197 | 3/2016 |
| JP | 2004139842 | 5/2004 |
| JP | 2005310509 | 11/2005 |
| JP | 2006228434 | 8/2006 |
| JP | 2007207725 | 8/2007 |
| KR | 20170139722 | 12/2017 |

\* cited by examiner

```
                                                              S10
┌─────────────────────────────────────────────────────────────┐
│ qualitatively determining a degradation type of the fuel cell stack │
│ according to a voltage-current curve of the fuel cell stack │
└─────────────────────────────────────────────────────────────┘
                              │
                              ▼                              S20
┌─────────────────────────────────────────────────────────────┐
│ quantitatively measuring parameter values of each of Individual │
│ cells of the fuel cell stack according to the degradation type, and │
│ quantitatively determining a degradation degree of each of the │
│ individual cells according to the parameter values          │
└─────────────────────────────────────────────────────────────┘
                              │                              S30
                              ▼
┌─────────────────────────────────────────────────────────────┐
│ determining a uniformity degradation degree among the       │
│ individual cells of the fuel cell stack according to a non- │
│ uniformity degree of a voltage distribution of the individual cells │
└─────────────────────────────────────────────────────────────┘
```

FIG. 1

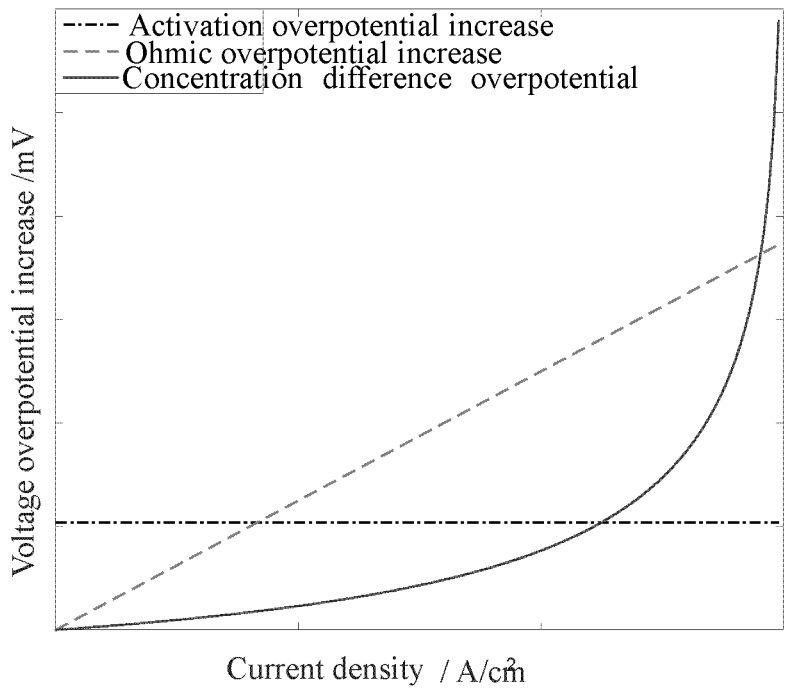

FIG. 2

METHOD FOR DIAGNOSING DEGRADATION OF FUEL CELL STACK, METHOD FOR MULTI-POINT ANALYSIS OF FUEL CELL, AND METHOD FOR ESTIMATING PERFORMANCE OF FUEL CELL MEMBRANE ELECTRODE

CROSS-REFERENCE TO RELATED APPLICATIONS

This application is a continuation application of PCT Patent Application No. PCT/CN2019/129122, entitled "METHOD FOR DIAGNOSING DEGRADATION OF FUEL CELL STACK, METHOD FOR MULTI-POINT ANALYSIS OF FUEL CELL, AND METHOD FOR ESTIMATING PERFORMANCE OF FUEL CELL MEMBRANE ELECTRODE", filed on Dec. 27, 2019, which claims priority to Chinese Patent Application No. 201811640164.5, entitled "METHOD FOR DIAGNOSING DEGRADATION OF FUEL CELL STACK", Chinese Patent Application No. 201811645164.4, entitled "METHOD FOR MULTI-POINT ANALYSIS OF FUEL CELL", and Chinese Patent Application No. 201811640094.3, entitled "METHOD FOR ESTIMATING PERFORMANCE OF FUEL CELL MEMBRANE ELECTRODE", all filed on Dec. 29, 2018, the content of which are incorporated as a whole.

TECHNICAL FIELD

The present disclosure relates to the field of batteries, and more particularly, to a method for diagnosing degradation of a fuel cell stack, a method for multi-point analysis of a fuel cell, and a method for estimating performance of a fuel cell membrane electrode.

BACKGROUND

A large-power fuel cell stack is formed by connecting a plurality of large-area fuel cells in series. In practical operation, the degradation rates of all cells are different. Since the individual cells work in series, the degradation of the performance of each cell limits the operation state of the entire fuel cell stack, and the failure of any cell must cause a failure of the performance of the entire stack. However, the existing methods for determining the degradation of a fuel cell are mainly applicable to cells in a laboratory, and a failure degree of the large-power fuel cell stack for a vehicle cannot be accurately determined.

SUMMARY

Accordingly, in view of a problem that a conventional method for determining degradation of a fuel cell cannot accurately determine a failure degree of a fuel cell stack, it is necessary to provide a method for diagnosing degradation of a large-power fuel cell stack for a vehicle.

A method for diagnosing degradation of a fuel cell stack includes:

S10, qualitatively determining a degradation type of the fuel cell stack according to a voltage-current curve of the fuel cell stack;

S20, quantitatively measuring parameter values of each of individual cells of the fuel cell stack according to the degradation type, and quantitatively determining a degradation degree of each of the individual cells according to the parameter values;

S30, determining a uniformity degradation degree among the individual cells of the fuel cell stack according to a non-uniformity degree of a voltage distribution of the individual cells.

A method for multi-point analysis of a fuel cell is provided. In the method, a fuel cell stack includes a first individual cell connected to a positive electrode of a fuel cell and a plurality of second individual cells connected in series with the first individual cell; each of individual cells comprises adjacent bipolar plates; a surface of each of the bipolar plates are provided with flow channels. The method including:

S400, providing a plurality of gas sampling points spaced apart at the cathode of the first individual cell, obtaining gas contents of different gas components in the cathode of the first individual cell by means of the gas sampling points, dividing the bipolar plate in which the cathode of the first individual cell is located into a plurality of first regions by means of the gas sampling points, and obtaining base current densities of the plurality of first regions based on the gas contents, wherein a direction of each base current density is from a negative electrode to the positive electrode inside the fuel cell stack, S500, dividing the bipolar plate in which the cathode of each of the second individual cells is located into a plurality of second regions corresponding to the first regions, obtaining potentials at two ends of each of the second regions along a flow channel direction, and calculating a transverse current density of each of the second regions along the flow channel direction based on the potentials and an internal resistance of each of the second regions, and S600, calculating a current density in each second region of the second individual cell by a current density formula according to the base current density and the transverse current density.

A method for estimating performance of a fuel cell membrane electrode includes:

S700, selecting a plurality of constant current values for charging a fuel cell stack, monitoring first voltage values of each of individual cells in the fuel cell stack, and obtaining a first hydrogen leakage current value of a membrane electrode of each of the individual cells based on the constant current values and the first voltage values, S800, selecting a plurality of current density values as reaction discharge current density values of the fuel cell stack, monitoring second voltage values of each of the individual cells in the fuel cell stack, and obtaining a second hydrogen leakage current value of each of the individual cells by a fitting algorithm based on the current density values and the second voltage values, and S900, obtaining a corrected hydrogen leakage current value of each of the individual cells based on the first hydrogen leakage current value and the second hydrogen leakage current value.

BRIEF DESCRIPTION OF THE DRAWINGS

FIG. 1 is a flow chart of a method for diagnosing degradation of a fuel cell stack according to an embodiment of the present disclosure;

FIG. 2 is a schematic diagram illustrating a relationship between a voltage overpotential increase and a current density according to an embodiment of the present disclosure;

DETAILED DESCRIPTION OF THE EMBODIMENTS

Figure 3:
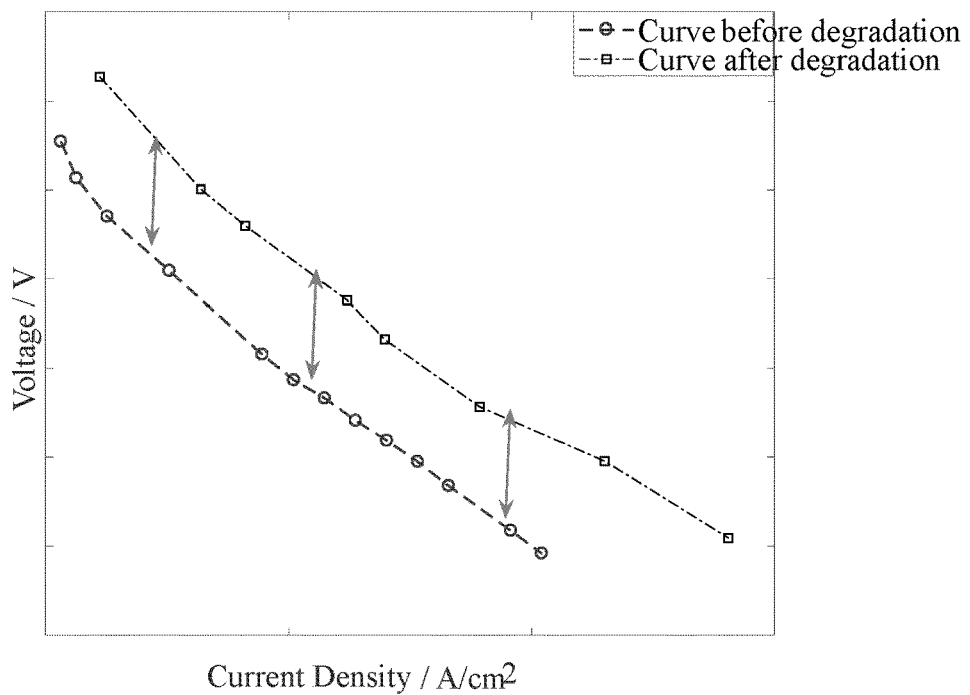
FIG. 3 is a schematic diagram illustrating a relationship between a voltage and a current density according to an embodiment of the present disclosure.

Referring to FIG. 1, an embodiment of the present disclosure provides a method for diagnosing degradation of a fuel cell stack. The method includes:

S10, qualitatively determining a degradation type of the fuel cell stack according to a voltage-current curve of the fuel cell stack;

S20, quantitatively measuring parameter values of each of individual cells 20 of the fuel cell stack according to the degradation type, and quantitatively determining a degradation degree of each of the individual cells 20 according to the parameter values;

S30, determining a uniformity degradation degree among the individual cells 20 of the fuel cell stack according to a non-uniformity degree of a voltage distribution of the individual cells 20.

In step S10, the voltage-current curve of the fuel cell stack conforms to a typical electrochemical power source characteristic. As the output current increases, the output voltage drops significantly. For different types of overpotential increases of the fuel cell stack, the overpotential increases of the voltage-current curves are different. Degradation types of the fuel cell stack may include an activation overpotential increase, a concentration difference overpotential increase, and an ohmic overpotential increase. The degradation type of the fuel cell stack can be qualitatively determined according to a manner of the overpotential increase of the voltage-current curve. A fuel cell stack may simultaneously include different degradation types. The fuel cell stack 310 may be a proton exchange membrane fuel cell stack 310, a solid oxide fuel cell stack 310, an alkaline fuel cell stack 310, a direct methanol fuel cell stack, or the like.

In step S20, related parameter values of each of the individual cells 20 of the fuel cell stack 310 may be obtained by a plurality of measurement methods, and the degradation degree of each of the individual cells 20 may be quantitatively determined according to the parameter values, and then the degradation degree of the entire fuel cell stack may be further determined.

In an embodiment, the degradation type of the fuel cell stack with the greatest degradation degree may be further selected according to the different degradation types of the fuel cell stack determined in step S10, and a quantitative analysis may be performed on this degradation type to further determine an improvement scheme. It will be appreciated that the process of quantitatively measuring the parameter values of each cell 20 of the fuel cell stack and the process of qualitatively determining the degradation type of the fuel cell stack in step S10 may be two processes which are relatively independent from each other. Therefore, by qualitatively and quantitatively determining the degradation condition of the fuel cell stack, the determination result can be more accurate.

In step S30, the individual cell 20 having a large degradation degree may be further analyzed to determine a specific functional degradation position of the individual cell 20. In an embodiment, a voltage patrol detection method may be used to determine the specific functional degradation position of the individual cell 20.

In the embodiment of the present disclosure, the degradation type of the fuel cell stack is first qualitatively determined, and the degradation condition of the entire fuel cell stack can be obtained. By quantitatively measuring the parameter values of each of the individual cells 20 of the fuel cell stack, the degradation condition of each of the individual cells 20 can be specifically obtained. Finally, by determining the degradation degree of the uniformity of each of the individual cells 20, a specific degradation portion of each of the individual cells 20 can be determined. Therefore, the degradation degree of the fuel cell stack can be accurately determined by the method for diagnosing degradation of the fuel cell stack.

In an embodiment, the step S10 includes:

determining that the degradation type of the fuel cell stack is an activation overpotential increase if a voltage of a current voltage-current curve of the fuel cell stack, compared with that of an initial voltage-current curve of the fuel cell stack, decreases and makes a downwards translation within an entire operating current range;

determining that the degradation type of the fuel cell stack is a concentration difference overpotential increase if a voltage drop of a current voltage-current curve of the fuel cell stack relative to an initial voltage-current curve of the fuel cell stack increasingly accelerates with increasing current density;

determining that the degradation type of the fuel cell stack is an ohmic overpotential increase if a voltage drop of a voltage-current curve of the fuel cell stack relative to an initial voltage-current curve of the fuel cell stack linearly accelerates with increasing current density.

Referring to FIG. 2, in the present embodiment, when the activation overpotential of the fuel cell increases, the voltage of the current voltage-current curve of the fuel cell decreases and makes a downwards translation within the entire operating current range. When the concentration difference overpotential of the fuel cell increases, the voltage drop of the current voltage-current curve of the fuel cell relative to the initial voltage-current curve of the fuel cell stack increasingly accelerates with the increasing current density. When the ohmic overpotential of the fuel cell increases, the voltage drop of the current voltage-current curve of the fuel cell relative to the initial voltage-current curve of the fuel cell stack linearly accelerates with the increasing current density.

Referring to FIG. 3, when an evident translation is shown in results of two voltage-current curve tests, it may be determined that an increase in the active polarization occurs in the fuel cell stack. The test is swift and convenient.

In an embodiment, the parameter values in step S20 include an internal resistance value, an active area value, a hydrogen leakage current value, and a double-layer capacitance value.

In an embodiment, the internal resistance value of the individual cell 20 is obtained by an alternating-current impedance method. The membrane impedance of each of the individual cells 20 can be obtained by high frequency impedance values. It will be appreciated that the high frequency impedance of the fuel cell represents the magnitude of the membrane impedance and thus the method can be used for a membrane impedance estimation. In an impedance test, the current perturbation can be selected. The original constant current is $I_{constant\ current}$, a small perturbation current $I_{current\ perturbation}$ (f, A) is added to the output current, where A is a perturbation amplitude, and f is the perturbation frequency. The current of the individual cell 20 is I (f, A)=$I_{constant\ current}$+$I_{current\ perturbation}$ (f, A). In an embodiment, the perturbation amplitude A accounts for less than 5% of the constant current. It will be appreciated that the perturbation can be implemented by an electrochemical workstation or a high frequency impedance meter. The response voltage of each of the individual cells 20 can be obtained by a voltage patrol detection. The impedance can be calculated on the basis of the response voltage. In a specific test, the high frequency impedance of the fuel can be measured by using a fixed frequency. In an embodiment, a high frequency impedance of 400 Hz or more may be used for a measurement. The membrane impedance R can be obtained by $$R = \frac{U(f, A)}{I(f, A)}.$$

In an embodiment, the internal resistance value of the individual cell 20 may also be measured by using a current interruption method.

In an embodiment, the active area value, the hydrogen leakage current value, and the double-layer capacitance value of the individual cell 20 are obtained by a constant current method.

In an embodiment, the obtaining the active area value, the hydrogen leakage current value, and the double-layer capacitance value of the individual cell 20 by a constant current method includes:

S210, supplying hydrogen to an anode of the fuel cell stack, and supplying nitrogen to a cathode of the fuel cell stack;

S220, supplying, by a constant current source, a constant charging current to the fuel cell stack, raising a cathode potential, and recording a voltage value of the individual cell 20;

S230, obtaining the hydrogen leakage current value and the double-layer capacitance value of the individual cell 20 based on the voltage value, a derivative of the voltage with respect to time, and the charging current; and S240, obtaining the active area value based on the charging current, the hydrogen leakage current value, the voltage value, hydrogen adsorption amount per unit area of a catalyst surface of the individual cell 20, and the catalyst loading amount per unit area of the individual cell 20.

In step S220, the constant current source may be a high-precision constant current source.

In an embodiment, step S230 is performed after a duration of supplying hydrogen to the anode and nitrogen to the cathode reaches a preset period of time. In an embodiment, the time for stably supplying hydrogen to the anode and nitrogen to the cathode may be 1 to 2 hours, so that the gas inside the fuel cell stack reaches an equilibrium state.

In an embodiment, in step S220, the magnitude of the charging current is changed several times, and several sets of voltage values of the individual cells 20 are recorded. The active area value, the hydrogen leakage current value, and the double-layer capacitance value can be calculated according to the several sets of voltage values and the charging currents.

Figure 4:
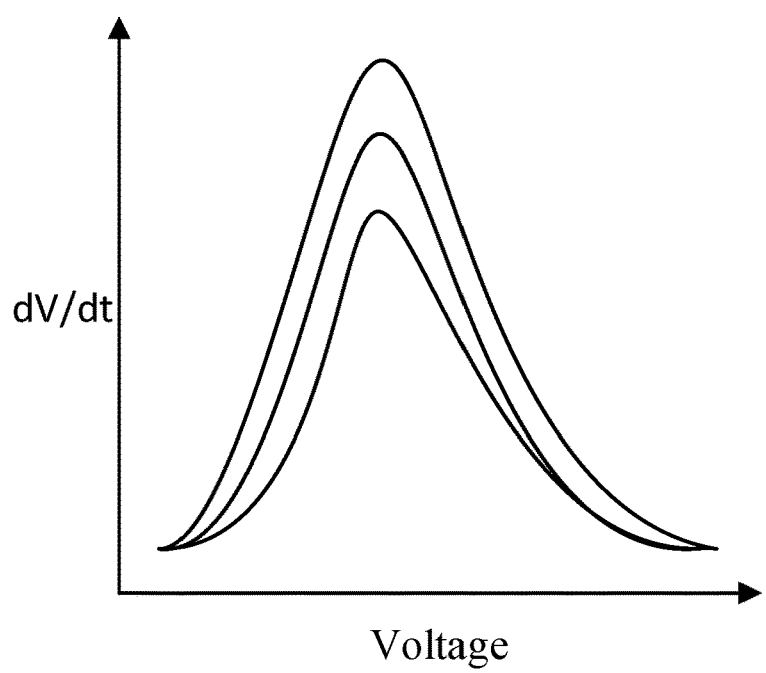
FIG. 4 is a schematic diagram illustrating a relationship between dV/dt and a voltage according to an embodiment of the present disclosure.

Referring to FIG. 4, in step S230, process the voltage value V to get dV/dt, where a highest point of dV/dt generally occurs at a position of a determined voltage, to obtain a result corresponding to each charging current.

According to the dV/dt value of the highest point of each constant-current charging result and the charging current $I_{GA}$, the double-layer capacitance $C_{dl}$ and the hydrogen leakage current $i_{H2}$ of each cell 20 can be obtained by a fitting method, namely by integrating the following equations.

$$\begin{cases} I_{GA}|_1 = C_{dl}\frac{dV}{dt}\bigg|_1 + i_{H_2} \\ I_{GA}|_2 = C_{dl}\frac{dV}{dt}\bigg|_2 + i_{H_2} \\ \cdots \\ I_{GA}|_n = C_{dl}\frac{dV}{dt}\bigg|_n + i_{H_2} \end{cases}.$$

In step S240, the active area value can be obtained on the basis of the charging current $I_{GA}$, the hydrogen leakage current $i_{H2}$, the power supply value V, the hydrogen adsorption amount $Q_{H,A}$ per unit area, of the catalyst surface of the individual cell 20 and the catalyst loading amount $W_{pt}$ per unit area of the individual cell 20 and according to the following formula:

$$ECSA = \frac{\int_0^{\overline{V}} \left(\frac{I_{GA} - i_{H_2}}{dV/dt} - C_{dl}\right) dV}{Q_{H,A} \cdot W_{pt}} [m^2 g^{-1}].$$

In an embodiment, in step S20, the quantitatively measuring parameter values of each of the individual cells 20 of the fuel cell stack, and quantitatively determining the degradation degree of the each cell 20 according to the parameter values includes:

S211, obtaining an ohmic overpotential change of the individual cell 20 according to a change of the internal resistance value and a discharge current during operation of the fuel cell stack;

S221, obtaining an activation overpotential change of the individual cell 20 according to a perturbation current amplitude and a change of the active area value of two measurements;

S231, obtaining a concentration difference overpotential change based on a degraded voltage value of the individual cell 20, the activation overpotential change, and the ohmic overpotential change; and S241, quantitatively determining the degradation degree of the individual cell 20 based on the ohmic overpotential change, the activation overpotential change, and the concentration difference overpotential change.

In step S211, the ohmic overpotential change is $\Delta U_{celli, ohmic} = i \times \Delta R_{celli}$, $\Delta R_{celli}$ denotes a difference between an internal resistance value in an initial measurement and in a current measurement, that is, the change of the internal resistance value. i denotes the discharge current during the operation of the fuel cell stack.

In step S221, the activation overpotential change is $$\Delta U_{act} = A \times \ln\left(\frac{S_{ECSA1}}{S_{ECSA2}}\right),$$

and $S_{ECSA2}$ are the active area values in the initial measurement and in the current measurement, respectively.

In step S231, the concentration difference overpotential change is:

$$\Delta U_{celli, concentration} = \Delta U - \Delta U_{celli, activation} - \Delta U_{celli, ohmic}$$

The degradation degree of the individual cell 20 can be quantitatively determined by the ohmic overpotential change, the activation overpotential change, and the concentration difference overpotential change.

Figure 5:
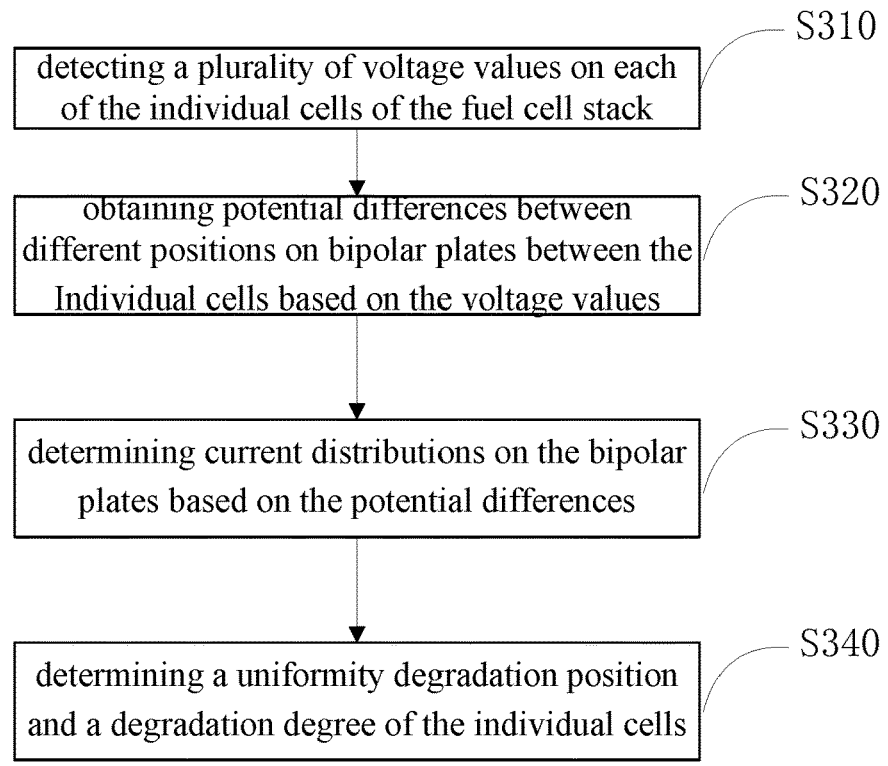
FIG. 5 is a flow chart of determining a degradation degree of a cell according to an embodiment of the present disclosure.

Referring to FIG. 5, in an embodiment, step S30 includes:

S310, detecting a plurality of voltage values on each of the individual cells 20 of the fuel cell stack;

S320, obtaining potential differences between different positions on bipolar plates between the individual cells 20 based on the voltage values;

S330, determining current distributions on the bipolar plates based on the potential differences; and S340, determining a uniformity degradation position and a degradation degree of the individual cell 20.

Figure 6:
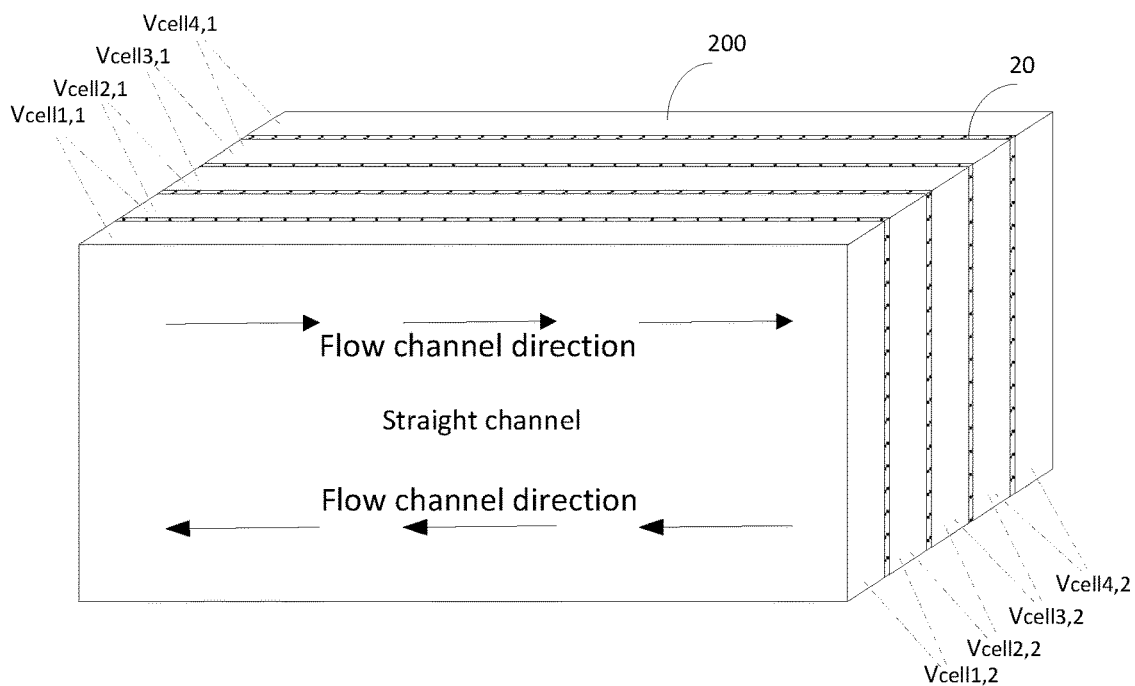
FIG. 6 is a schematic diagram illustrating a voltage patrol detection according to an embodiment of the present disclosure.

Referring to FIG. 6, in step S310, plural sets of voltage patrol detections may be arranged along the flow channel direction of the individual cell 20. A plurality of voltage values can be obtained through the plural sets of voltage detections. In step S320, the potential differences at different positions of the bipolar plate disposed between adjacent individual cells 20 can be obtained by the plurality of voltage values.

In step S330, for the fuel cell stack, the bipolar plates 200 at two ends are brought into contact with collector plates of copper respectively, and may be considered as equipotential bodies. The potential difference between the two voltage detection positions of other fuel cell bipolar plates 200 can be calculated by the patrol detection voltage value of each cell 20. Suppose the bipolar plate on the anode side of the individual cell 20 (K=1) located on the negative electrode side of the fuel cell stack to be an equipotential plate of 0V, a potential of the bipolar plate at each patrol detection position can be obtained by:

$$U_{bipolar\ plate\ i, position\ j} = \sum_{k=1}^{i-1} V_{cell\ k,\ position\ j}$$

where K=1, 2, 3, 4, and represents a K-th cell 20.

j=1, 2, where 1 and 2 represent two ends numbers of the bipolar plate 200, respectively.

The magnitude of a transverse current between two patrol detection points on the bipolar plate can be obtained according to potential differences between the different detection positions on the same bipolar plate. In an embodiment, if a relatively larger transverse current occurs in the bipolar plate, it indicates that there is a large difference between current distributions of the two cells 20 adjacent to the bipolar plate, and it can be determined that the deterioration degree of uniformity of the individual cells 20 in this region is relatively higher.

Figure 7:
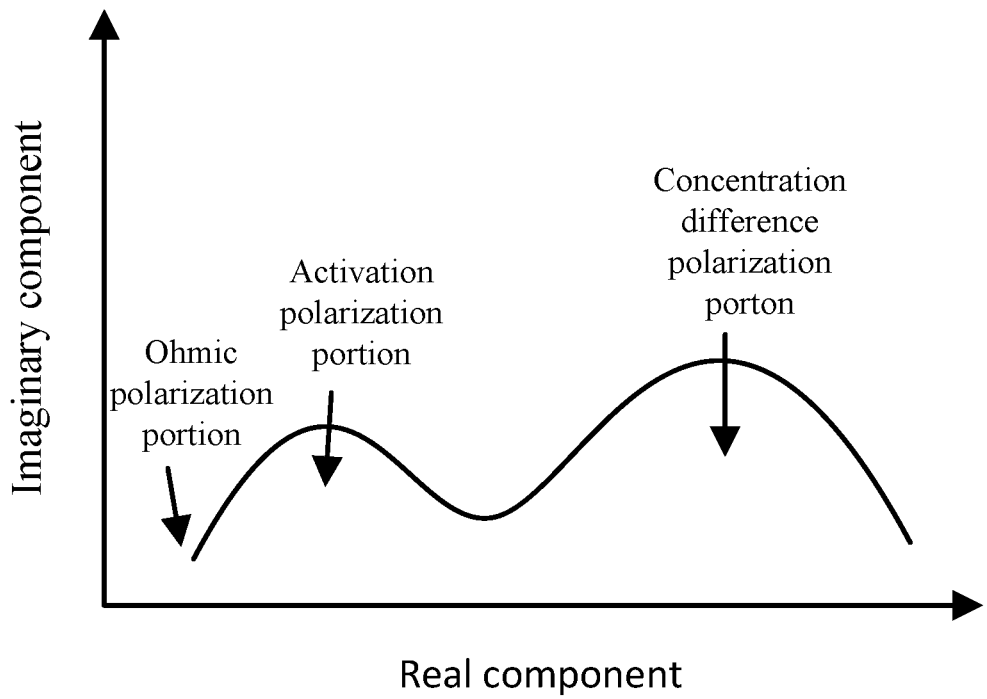
FIG. 7 is a schematic diagram illustrating a relationship between an imaginary component and a real component according to an embodiment of the present disclosure.

Referring to FIG. 7, in an embodiment, in step S10, the qualitatively determining the degradation type of the fuel cell stack may also be replaced with an alternating current (AC) impedance spectroscopy. By using the method of AC impedance spectroscopy, the proportion of the three types of overpotential increases at different operating current densities can also be obtained.

A fuel cell is an environmental friendly, efficient, and long-service-life power generation device. For example, in a proton exchange membrane fuel cell (PEMFC), a fuel gas enters from the anode side. A hydrogen atom loses an electron at the anode to become a proton, and the proton passes through the proton exchange membrane to the cathode, and the electron simultaneously reaches the cathode via an external circuit. At the cathode, the proton, the electron, and oxygen combine to form water. The fuel cell converts chemical energy into electric energy in a non-combustion manner, and not being limited by the Carnot cycle, direct power generation efficiency thereof may be as high as 50% or more.

In a common proton exchange membrane fuel cell individual structure, a solid polymer membrane capable of transferring protons is used as an electrolyte, and the electrolyte is sandwiched between catalyst layers of a cathode and of an anode. The catalyst layers and the membrane are collectively referred to as Membrane Electrode Assembly (MEA). The oxygen of the cathode and the hydrogen of the anode are diffused to the membrane electrode through a porous medium gas diffusion layer (Gas Diffusion Layer, GDL), respectively, and an oxidation reaction ($H_2-2H^*+e^-$) and a reduction reaction ($O_2+4H^++4e^-−2H_2O$) occur respectively there. Protons are transferred from the anode to the cathode through the proton exchange membrane, and electrons are transferred from the anode to the cathode through an external load. Since the voltage of an individual fuel cell is often less than IV, the voltage at normal operating conditions is about 0.6 to 0.7V. In a practical application, multiple individual fuel cells are often stacked in series to form the fuel cell stack 310.

The large-power fuel cell stack 310 is formed by connecting a plurality of large-area individual fuel cells 20 in series. The individual cell 20 is formed by sequentially laminating a bipolar plate 200 and a membrane electrode. In actual operation, the distributions of internal states of the individual cells 20 are different, which results in a different distribution of the internal current density of each cell 20 of the fuel cell stack. However, because of the series operation, the performance degradation of each cell 20 must limit the operation state of the entire fuel cell stack 310. Since the individual cells 20 are stacked in series, and are concealed inside the fuel cell stack. The performance condition of each cell 20 cannot be detected without destroying the structure of the fuel cell stack.

Figure 8:
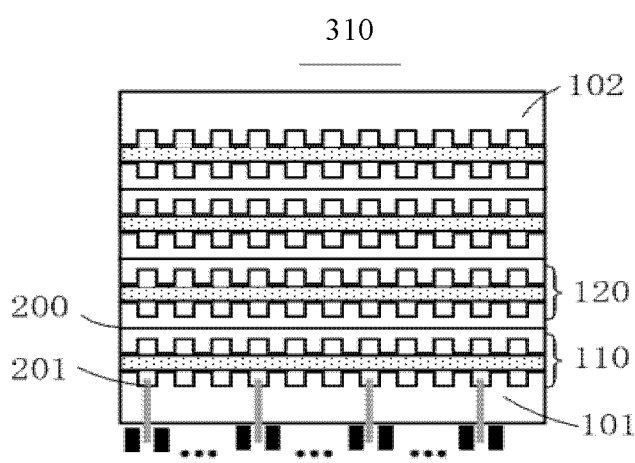
FIG. 8 is a schematic diagram illustrating a structure of a fuel cell stack according to an embodiment of the present disclosure.
Figure 9:
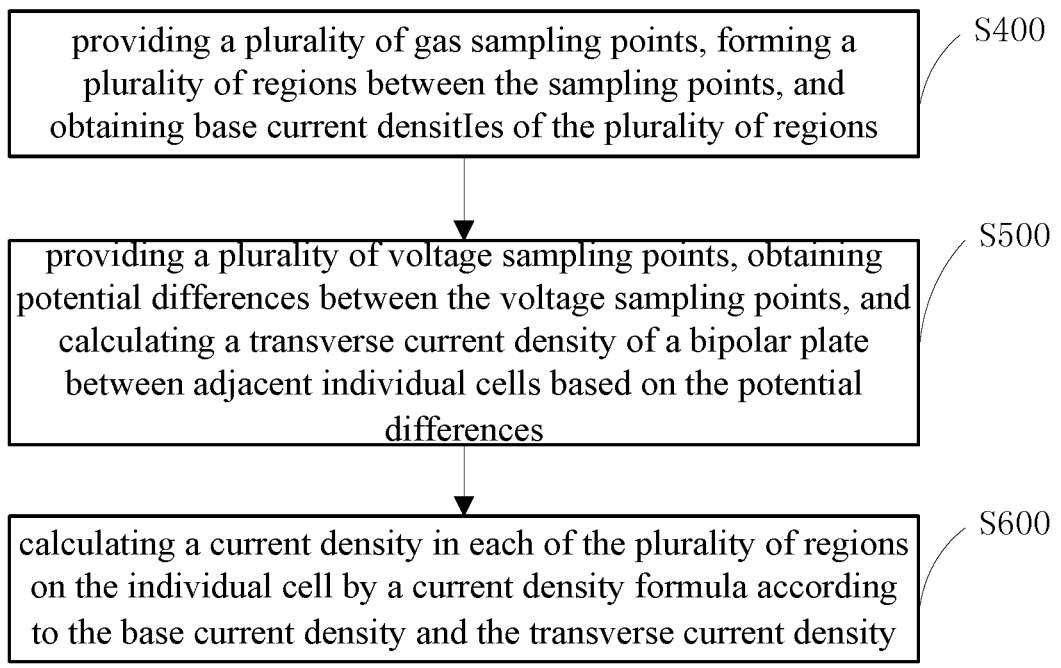
FIG. 9 is a flow chart of a method for multi-point analysis of a fuel cell according to an embodiment of the present disclosure.

Referring to FIGS. 8 and 9, an embodiment of the present disclosure provides a method for multi-point analysis of a fuel cell. The fuel cell stack 310 includes a first individual cell 110 connected to a positive electrode 101 of the fuel cell and a plurality of second individual cells 120 connected in series with the first individual cell 110. The individual cell includes adjacent bipolar plates 200 whose surfaces are provided with flow channels, and the individual cells 20 are divided into the first individual cells 110 and the second individual cells 120. The method includes:

S400, providing a plurality of gas sampling points spaced apart at the cathode of the first individual cell 110, obtaining gas contents of different gas components in the cathode of the first individual cell 110 by means of the gas sampling points, dividing the bipolar plate 200 in which the cathode of the first individual cell 110 is located into a plurality of first regions by means of the gas sampling points, and obtaining base current densities of the plurality of first regions based on the gas contents, a direction of each base current density is from the negative electrode 102 to the positive electrode 101 inside the fuel cell stack 310;

S500, dividing the bipolar plate in which the cathode of each of the second individual cells is located into a plurality of second regions corresponding to the first regions, obtaining potentials at two ends of each of the second regions along a flow channel direction, and calculating a transverse current density of each of the second regions along the flow channel direction based on the potentials and an internal resistance of each of the second regions; and S600, calculating a current density in each second region by a current density formula of the second individual cell 120 according to the base current density and the transverse current density.

According to the method for multi-point analysis of the fuel cell provided in the embodiment of the present disclosure, the base current density of the first individual cell 110 connected to the positive electrode 101 of the fuel cell is obtained by a gas sampling method. Then, by obtaining the potentials of the second cell 120, the transverse current density of the bipolar plate 200 in which the cathode of the second individual cell 120 is located can be obtained. Finally, the current density of the second individual cell 120 in each of the second regions is calculated on the basis of the base current density and the transverse current density. By the method for multi-point analysis of the fuel cell, the current density distribution of each of the individual cells 20 can be obtained without destroying the internal structure of the fuel cell stack. The performance condition of each of the individual cells 20 is determined by the current density distribution condition of each of the individual cells 20. The method for multi-point analysis of the fuel cell helps to improve the accuracy of the evaluation for the design of the fuel cell stack 310, thereby promoting structure optimization of the fuel cell stack.

Figure 10:
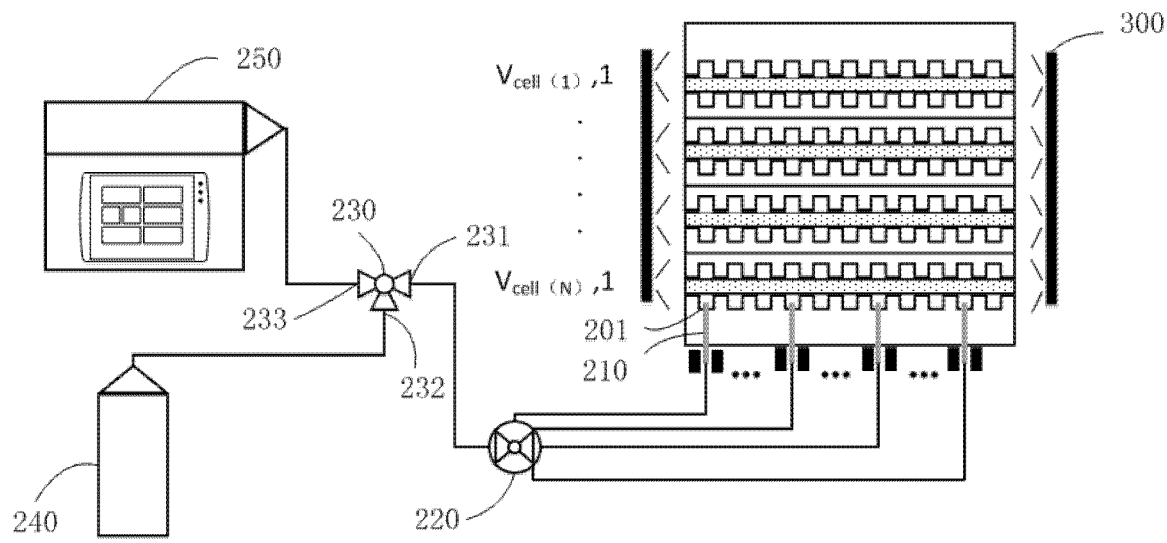
FIG. 10 is a schematic structural diagram illustrating devices related to the method for multi-point analysis of the fuel cell according to an embodiment of the present disclosure.

Further referring to FIG. 10, an embodiment of the present disclosure provides a method for multi-point analysis of the fuel cell. The method involves an overall structure including the fuel cell stack 310, a base current density measurement device, and a voltage sampling device 300.

Figure 11:
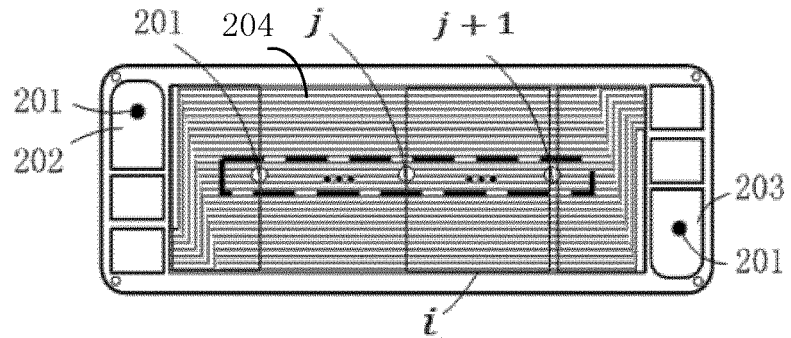
FIG. 11 is a schematic diagram illustrating a distribution of sampling points of a first individual cell according to an embodiment of the present disclosure.

As shown in FIGS. 8, 10 and 11, the fuel cell stack 310 includes the first individual cell 110 connected to the positive electrode 101 of the fuel cell and a plurality of the second individual cells 120 connected in series with the first individual cell 110. A plurality of gas sampling points is provided and spaced apart at the cathode of the first individual cell 110. A sampling port 201 is provided at each sampling point. The sampling ports 201 are provided at a cathode inlet 202, a cathode outlet 203, and the flow channels 204 of the bipolar plate 200. The position of the sampling port 210 may depend on the position of the point to be measured.

In an embodiment, the (n−1)-th cell and the n-th cell n share the n-th bipolar plate 200. The anode of the (n−1)-th bipolar plate 200, the cathode of the n-th bipolar plate 200, and the membrane electrode sandwiched between the two bipolar plates 200 together constitute the (n−1)-th cell. The direction of the basic current density is from the cathode of the n-th bipolar plate 200 to the anode of the (n−1)-th bipolar plate 200, that is, the direction from the negative electrode 102 to the positive electrode 101 inside the fuel cell stack 310.

Referring to FIGS. 10 and 11, the base current density measurement device includes capillary tubes 210, a multi-way valve 220, a three-way valve 230, a standard gas tank 240, and a mass spectrometer 250. One end of each capillary tube 210 communicates with a corresponding sampling port 201 for collecting the gas contents of different gas components at the sampling port 201. The bipolar plate 200 in which the cathode of the first individual cell 110 is located is divided into a plurality of first regions by the sampling ports 201. And a first region i is formed between a j-th sampling point and a (j+1)-th sampling point.

The multi-way valve 220 is connected to the other ends of the plurality of capillary tubes 210 by a pipe for selectively drawing gas from the capillary tubes 210. A first end 231 of the three-way valve 230 is connected to the multi-way valve 220. A second end 232 of the three-way valve 230 is connected to the standard gas tank 240. A third end 233 of the three-way valve 230 is connected to the mass spectrometer 250. The gas drawn through the multi-way valve 220, together with the standard gas 240 enters the mass spectrometer 250 to perform component analysis, so as to obtain the gas contents of different gas components of the sampling point at which the sampling port 201 is located.

The voltage sampling device 300 is capable of collecting voltages of different positions of the second individual cell 120 in the flow channel direction through voltage sampling points. The voltage sampling points are disposed at positions of each cell 120 corresponding to the gas sampling points.

In an embodiment, the voltage sampling device 300 is a voltage patrol detection device. Plural sets of voltage patrol detection devices are provided. Each set of the voltage detection device includes a voltage sampling terminal set with the same number as the number of the individual cells 20. The voltage sampling terminal set includes two voltage sampling terminals. The two voltage sampling terminals are electrically connected to the cathode and the anode of the individual cell 20, respectively, for measuring the voltage between the cathode and the anode of the individual cell 20.

In step S400, the bipolar plate 200 of the cathode of the first individual cell 110 is provided with a linear flow channel. Air enters the flow channel from the cathode inlet, and oxygen in the air takes part in the reduction reaction and exits from the cathode outlet. Oxygen in the air is gradually consumed in the flow channel direction. By detecting the consumption of oxygen, the quantity of electrons in the reduction reaction can be calculated. Further, the base current density of the plurality of the first regions is obtained. In the flow channel direction, the oxygen content in the air gradually decreases, the rate of reaction gradually decreases, and the base current densities of the plurality of the first regions decrease accordingly.

In S500, the (n−1)-th cell and the n-th cell share the n-th bipolar plate 200, and the anode of the (n−1)-th bipolar plate 200, the cathode of the n-th bipolar plate 200, and the membrane electrode sandwiched between the two bipolar plates 200 constitute the (n−1)-th cell. The bipolar plate 200 in which the cathode of each of the second individual cells 120 is located is provided with a plurality of second regions i' corresponding to the first regions i. Since each of the individual cells of the fuel cell stack operates in series, two of the individual cells proximate to the n-th bipolar plate 200 are the (n−1)-th cell and the n-th cell, respectively. Therefore, the transvers current density in the second region i' of the n-th bipolar plate 200 is the difference between the current densities in the second region i' respectively corresponding to the (n−1)-th cell and the n-th cell of the fuel cell stack. The current in the second region i' of the n-th bipolar plate 200 flows transversely, forming the transverse current density.

The n-th bipolar plate 200 in which the cathode of the n-th cell is located is divided into a plurality of the second regions i' in the flow channel direction. When the current density of the (n−1)-th cell and the current density of the n-th cell from the cathode to the anode are different, the potentials of two ends of the second region i' are different. As the potentials are different, electrons will flow from the low-potential end to the high-potential end, forming a current. Based on the potentials of two ends of the second region i' and the internal resistance of the second region i', the transverse current density of the second region i' of the n-th bipolar plate 200, namely the difference between the current densities in the second region i' respectively corresponding to the (n−1)-th cell and the n-th cell of the fuel cell stack, can be obtained.

S600, subtracting the base current density of the first region i from the difference between the current densities in the second region i' respectively corresponding to the (n−1)-th cell and the n-th cell of the fuel cell stack, to obtain the current density of the n-th cell in the second region i'. The difference between the current densities in the second region i' respectively corresponding to the (n−1)-th cell and the n-th cell of the fuel cell stack is equal to the transverse current density of the second region i' of the n-th bipolar plate 200, therefore the base current density of the first region i subtracted from the difference between the current densities in the second region i' respectively corresponding to the (n−1)-th cell and the n-th cell of the fuel cell stack is the current density in the second region i' corresponding to the n-th cell. By analogy, the current densities in different second regions corresponding to the n-th cell can be calculated, and the current density distribution of the n-th cell can be obtained.

The current density distribution of other cells of the fuel cell stack 310 may also be obtained by the above method. By the method for multi-point analysis of the fuel cell, the current density distribution of each of the individual cells 20 can be obtained without destroying the internal structure of the fuel cell stack. Based on the current density distribution state of each of the individual cells 20, the performance state of the individual cells 20 can be determined. The method for multi-point analysis of the fuel cell helps to improve the accuracy of the design evaluation of the stack 310, thereby promoting structure optimization of the fuel cell stack.

Figure 12:
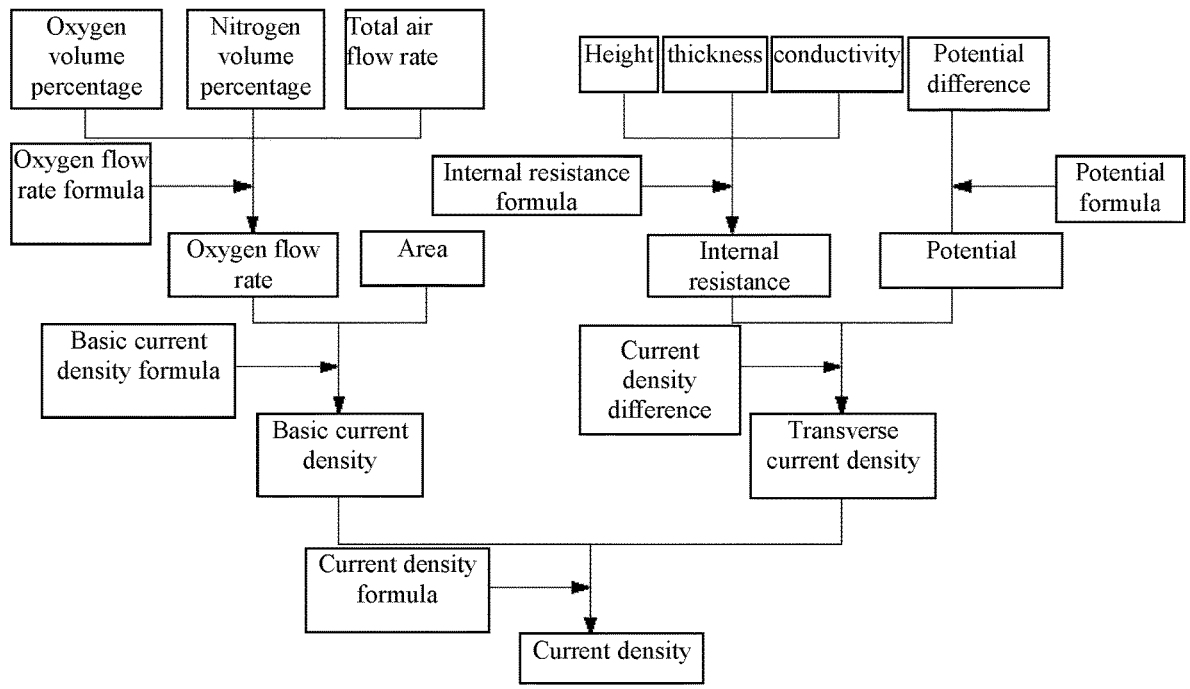
FIG. 12 is a flow chart of calculating parameters related to the method for multi-point analysis of the fuel cell according to an embodiment of the present disclosure.

Referring to FIG. 12, in an embodiment, prior to step S400, the method further includes:

S010, obtaining a total air flow rate at the air inlet of the fuel cell and an area of the first region.

The total air flow at the air inlet of the fuel cell is the air flow at the cathode inlet. The area of the first region i is the product of the thickness and height of the bipolar plate 200 in the flow channel direction.

In an embodiment, in step S400, the gas contents of different gas components include an oxygen volume percentage and a nitrogen volume percentage.

Air enters through the cathode inlet. The nitrogen volume percentage in the air was about 78%, and nitrogen is an inert gas. For the fuel cell, since the proportion of water vapor is uncertain, it is difficult to determine the reaction amount of the oxygen by directly calculating the oxygen content based on a volume percentage. Since the nitrogen in the cathode flow channel does not participate in the reaction, the total amount of nitrogen can be considered to be constant, and the total amount of nitrogen is used as a reference value to calculate the oxygen flow rate.

Figure 13:
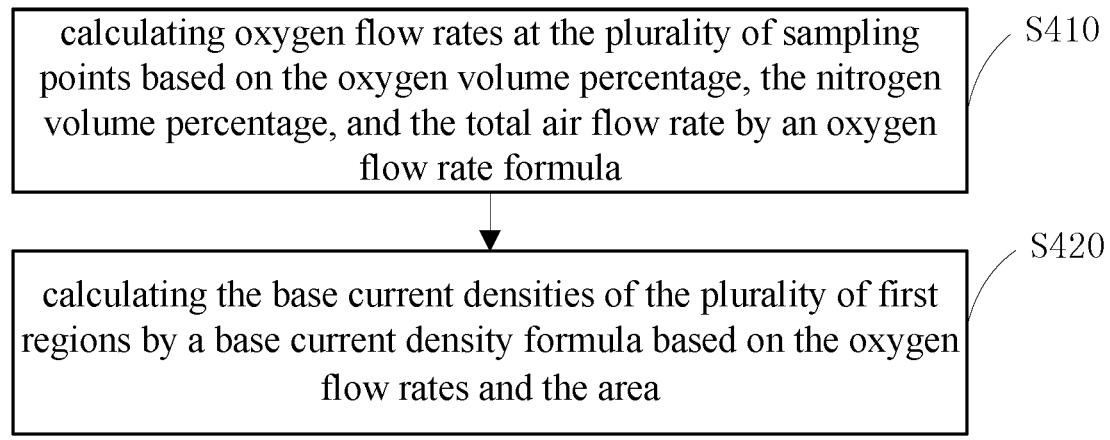
FIG. 13 is a flow chart of calculating a basic current density according to an embodiment of the present disclosure.

Referring to FIG. 13 together, in an embodiment, in step S400, the obtaining the base current densities of the plurality of first regions based on the gas contents includes following steps.

In step S410, calculate oxygen flow rates at the plurality of sampling points based on the oxygen volume percentage, the nitrogen volume percentage, and the total air flow rate by using an oxygen flow rate formula.

In step S420, calculate the base current densities of the plurality of regions by a base current density formula based on the oxygen flow rates and the area.

In an embodiment, the oxygen volume percentages, the nitrogen volume percentages, and the total air flow rates at the j-th sampling point and the (j+1)-th sampling point are obtained, and the oxygen flow rates at the j-th sampling point and the (j+1)-th sampling point are calculated by an oxygen flow rate formula. A basic current density of the first region i is calculated by using a basic current density formula based on the oxygen flow rates at the j-th sampling point and the (j+1)-th sampling point and the area of the first region i formed between the j-th sampling point and the (j+1)-th sampling point. The base current densities of the plurality of the first regions, i.e., the current density distribution of the first individual cell 110, can be obtained separately by the above method.

Figure 14:
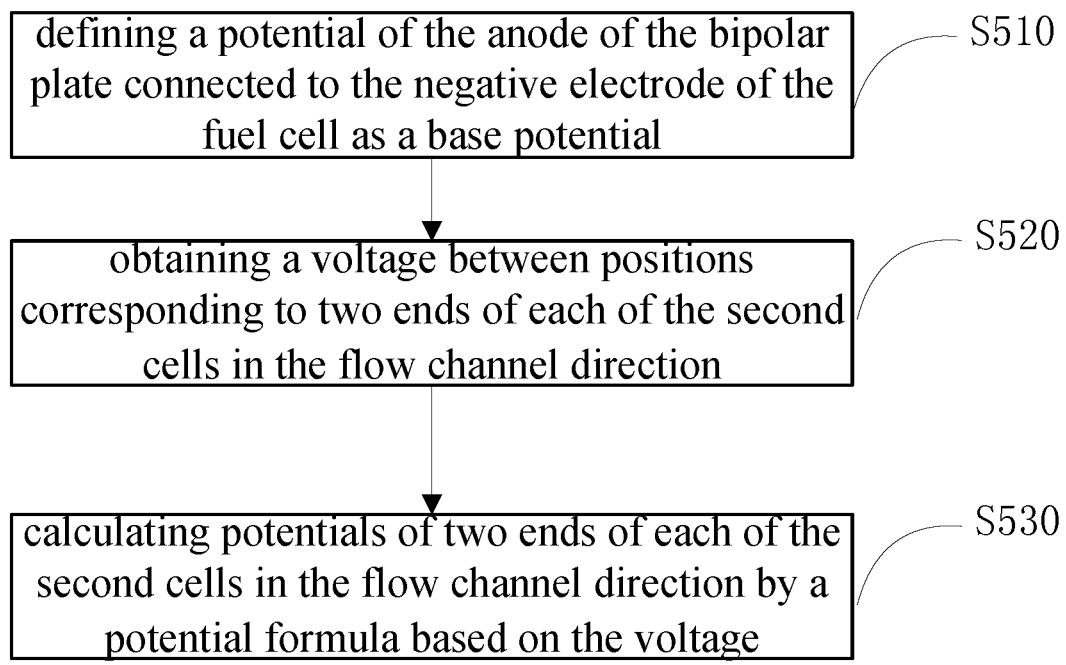
FIG. 14 is a flow chart of calculating a potential across a second region according to an embodiment of the present disclosure.

Referring to FIG. 14 together, in an embodiment, the obtaining the potentials at two ends of each of the second regions along the flow channel in step S500 includes:

S510, defining a potential of the anode of the bipolar plate 200 connected to the negative electrode 102 of the fuel cell as 0V;

S520, obtaining a voltage between positions corresponding to two ends of each of the second individual cells in the flow channel direction; and S530, calculating potentials of two ends of each of the second individual cells in the flow channel direction by a potential formula based on the voltage.

The potential of the anode of the bipolar plate 200 connected to the negative electrode 101 side of the fuel cell is defined as the reference potential of 0V. The voltage of any of the second individual cells 120 may be obtained by the voltage sampling device 300. Since the relative positions of the second individual cells 120 with respect to the bipolar plate 200 connected to the negative electrode 102 side of the fuel cell are different, the potentials of the cathode of the second individual cells 120 are different. By superimposing a plural sets of voltages between the bipolar plate 200 in which the cathode of a second individual cell 120 is located and the bipolar plate 200 connected to the negative electrode 102 side of the fuel cell, a potential of the bipolar plate 200 in which the cathode of the second individual cell 120 is located can be obtained. It is known that the voltage between any positions of any of the second individual cells 120 can be directly obtained by the voltage sampling device 300, and the potentials of two end of each of the second regions in the flow channel direction can be calculated.

In an embodiment, the calculating the transverse current density channel of each of the second regions along the flow channel direction based on the potential and the internal resistance of each of the second regions in step S500 includes:

S540, obtaining a height of each of the second regions, and a thickness and a conductivity of each of the bipolar plates 200;

S550, calculating the internal resistance of each of the second regions based on the height of each of the second regions, and the thickness and the conductivity of each of the bipolar plates 200, by using an internal resistance formula; and S560, calculating a transverse current density channel of each of the second regions in the flow channel direction according to a current density difference formula based on the potential and the internal resistance of each of the second regions.

The bipolar plate 200 connected to the positive electrode 101 side of the fuel cell is defined as the first bipolar plate 200. The bipolar plate 200 connected to the negative electrode 102 side of the fuel cell is defined as the n-th bipolar plate 200, that is, the bipolar plate 200 connected to the cathode 102 side of the first individual cell 110 is defined as the n-th bipolar plate 200. The (n−1)-th cell and the n-th cell share the n-th bipolar plate 200. The transverse current density of the second region i' of the n-th bipolar plate 200 can be obtained by step S500. The transverse current density of the second region i' of the n-th bipolar plate 200 is equal to the current density difference between the (n−1)-th cell and the n-th cell on which the n-th bipolar plate 200 is located. Therefore, the current density difference between the (n−1)-th cell and the n-th cell can be obtained by step S500. The n-th cell is separated from the first individual cell 110 by cells 20 having the number of (N−n−1).

In an embodiment, in step S110, the oxygen flow rate formula is:

$$f_{O_2}(j) = \frac{\beta_{O_2,j}\%}{\beta_{N_2,j}\%} \times f_A \times P_{N_2}\% \quad (1)$$

Where $f_{O_2}(j)$ denotes the oxygen flow rate at the j-th sampling point, $\beta_{O_2,j}\%$ denotes the oxygen volume percentage at the j-th sampling point, $\beta_{N_2,j}\%$ denotes the nitrogen volume percentage of the j-th sampling point, $f_A$ denotes the total air flow rate at the air inlet of the fuel cell, and $P_{N_2}\%$ denotes the nitrogen percentage in the air.

In an embodiment, in step S120, the basic current density formula is:

$$C_N(i) = \frac{f_{O_2}(j+1) - f_{O_2}(j)}{M_{O_2}} \times F \times \frac{1}{S_i} \quad (2)$$

The bipolar plate 200 connected to the positive electrode 101 side of the fuel cell is defined as the n-th bipolar plate 200, i denotes the first region between the j-th sampling point and the (j+1)-th sampling point, where $C_N(i)$ denotes the base current density of the n-th bipolar plate 200 in the first region and a unit thereof is A/cm², $M_{O_2}$ denotes the molar mass of oxygen, F denotes a Faraday constant, and $S_i$ denotes the area of the first region i.

Figure 15:
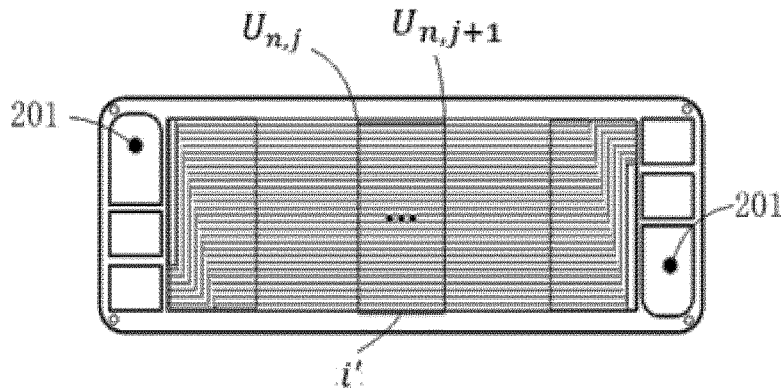
FIG. 15 is a schematic diagram illustrating a structure of a second individual cell according to an embodiment of the present disclosure.

Referring to FIG. 15, in an embodiment, in step S530, the potential formula is:

$$U_{n,j} = \sum_{k=1}^{n-1} V_{cell(k),j} \quad (3)$$

The bipolar plate 200 connected to the negative electrode 102 side of the fuel cell is defined as the first bipolar plate 200, where the (n−1)-th cell and the n-th cell share the n-th bipolar plate 200, k denotes any one of the individual cells, i' denotes the second region of the n-th bipolar plate 200 corresponding to the first region i, $V_{cell(k),j}$ denotes the voltage at a position of each of the second individual cells 120 corresponding to the second region i' in the flow channel direction, and $U_{n,j}$ denotes the potential at a position of the n-th bipolar plate 200 corresponding to the j-th sampling point.

In step S550, the internal resistance formula is:

$$R_n(i') = \frac{1}{\sigma} \times \frac{1}{h \times \delta} \quad (4)$$

$R_n(i')$ denotes an internal resistance of the second region i', h denotes a height of the second region i', σ denotes a conductivity, δ denotes a thickness of the second region i', and l denotes a length of the second region i'.

In step S560, the current density difference formula is:

$$\dot{C}_n(i') = \frac{U_{n,j+1} - U_{n,j}}{R_n(i')} \times \frac{1}{S_{i'}} \quad (5)$$

$\dot{C}_n(i')$ denotes the transverse current density of the second region i' of the n-th bipolar plate 200, that is, the current density difference between the (n−1)-th cell and n-th cell in which the n-th bipolar plate 200 is located, $U_{n,j+1}$ denotes the potential at a position corresponding to the sampling point j+1 of the n-th bipolar plate 200, and $S_{i'}$ denotes the area of the second region i'.

In an embodiment, in step S600, the current density formula is:

$$C_n(i') = C_N(i) - \sum_{k=n-1}^{N} \dot{C}_k(i') \qquad (6)$$

Where $C_n(i')$ denotes the current density of the second region i' of any of the n-th cells.

The large-power fuel cell stack is formed by a plurality of large-area individual fuel cells connected in series, the total current flowing through each of the individual cells in series is the same, and the voltages of the individual cells are connected in series to provide an external high voltage. In actual operation, the degradation rates of the individual cells are different. However, due to the series operation, the degradation of the performance of each cell limits the maximum operation state of the entire fuel cell stack.

For a multi-chip fuel cell stack, if the performance of the membrane electrode of an individual cell is found to be degraded during operation, it is necessary to determine the reason of causing the performance degradation of the cell timely. The diagnosed results can be well used for optimal control and solving the present problems. The performance of the fuel cell stack is improved, and the service life thereof is prolonged. However, in the conventional art, the accuracy of the estimation of the performance of the membrane electrode is insufficient and vulnerable to interference by environmental factors.

Figure 16:
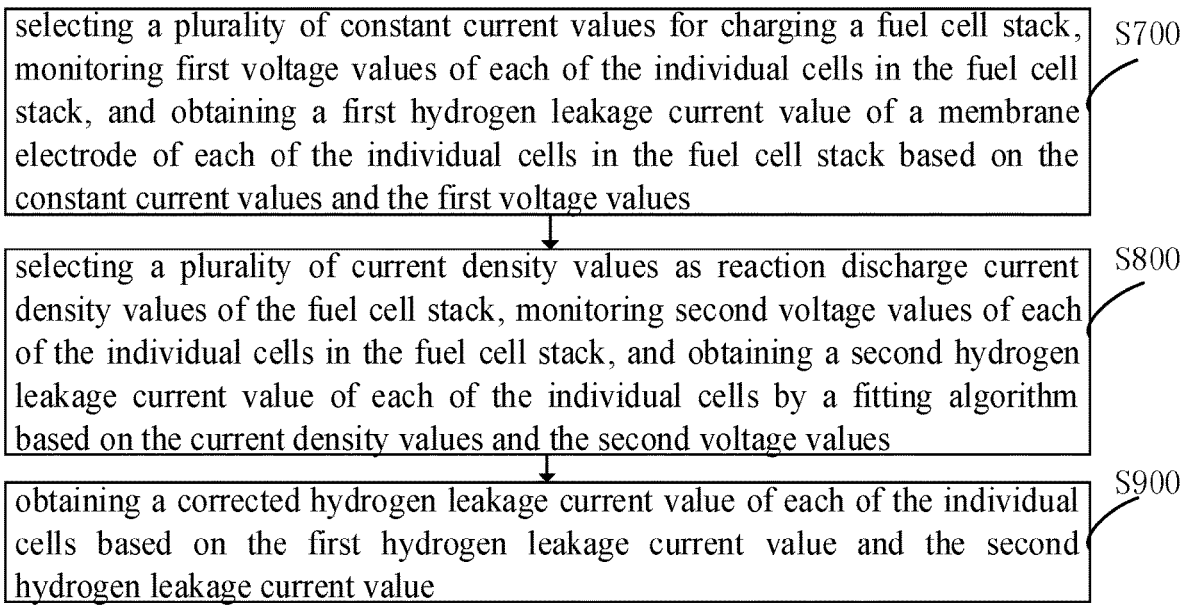
FIG. 16 is a flowchart of a method for estimating performance of a fuel cell membrane electrode according to an embodiment of the present disclosure.

Referring to FIG. 16, an embodiment of the present disclosure provides a method for estimating performance of a fuel cell membrane electrode. The method includes:

S700, selecting a plurality of constant current values for charging a fuel cell stack 310, monitoring first voltage values of each of the individual cells 20 in the fuel cell stack 310, and obtaining a first hydrogen leakage current value of a membrane electrode of each of the individual cells 20 in the fuel cell stack based on the constant current values and the first voltage values;

S800, selecting a plurality of current density values as reaction discharge current density values of the fuel cell stack, monitoring second voltage values of each of the individual cells 20 in the fuel cell stack 310, and obtaining a second hydrogen leakage current value of each of the individual cells 20 by a fitting algorithm based on the current density values and the second voltage values; and S900, obtaining a corrected hydrogen leakage current value of each of the individual cells 20 based on the first hydrogen leakage current value and the second hydrogen leakage current value.

In step S700, the individual cells 20 are connected in series to form the fuel cell stack 310. Each of the individual cell 20 may include a membrane electrode and a bipolar plate 200. After the first voltage values and the constant current values are obtained by a constant current charging method, a double-layer capacitance parameter and an active area parameter of the membrane electrode can also be obtained by a mathematical operation.

Figure 17:
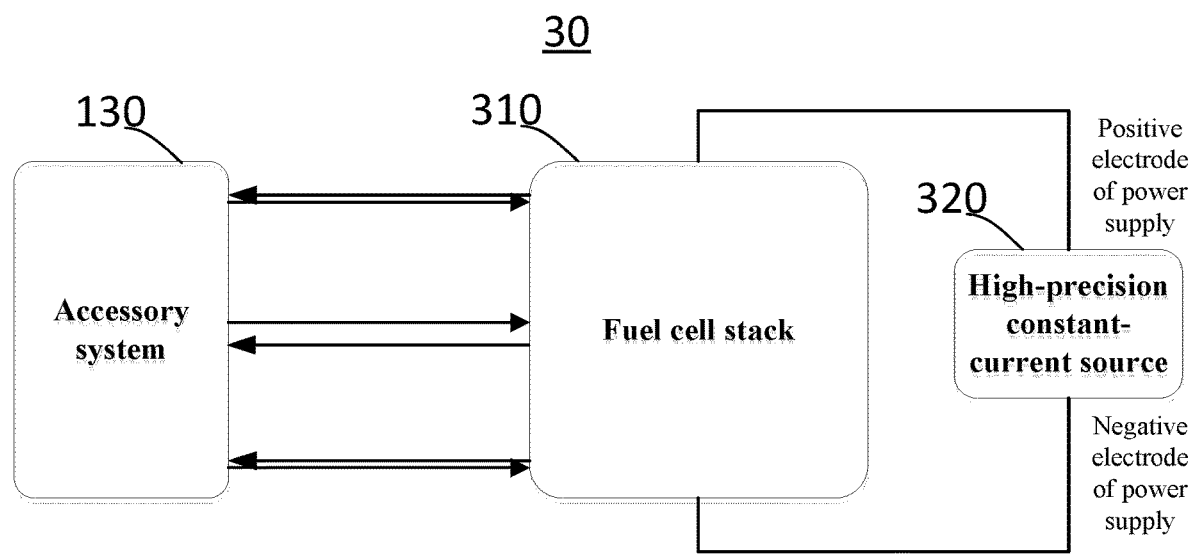
FIG. 17 is a schematic diagram illustrating a constant current charging apparatus according to an embodiment of the present disclosure.

Referring to FIG. 17, the membrane electrode can be tested by the constant current charging device 30. The constant current charging device 30 may include a high-precision constant current source 320 and an accessory system 130. The accessory system 130 may include an air supply system, and a cooling system. The temperature of the fuel cell stack 310 can be controlled by a cooling system. The temperature of the fuel cell stack 310 may be in the range of 60° C.-80° C. Gas may be supplied to the cathode and anode of the fuel cell stack 310 through the gas supply system. The gas may be hydrogen, air, or nitrogen. The fuel cell stack 310 may be supplied with high-precision current through the high-precision constant current source 320. In an embodiment, the high-precision constant current source 320 has an accuracy higher than 0.01 A. The high-precision constant current source 320 may have a function of a step change. The high-precision constant current source 320 may instantaneously increase the current from 0 A to a target current.

When a parameter of the membrane electrode is identified by the constant current charging method, and when it is necessary to obtain parameters of the active area of each cathode side of each of the individual cells 20, the positive electrode of the high-precision constant current source 320 is connected to the positive electrode of the fuel cell stack 310, the negative electrode of the high-precision constant current source 320 is connected to the negative electrode of the fuel cell stack 310, nitrogen is supplied into the cathode side of the fuel cell stack 310, and hydrogen is supplied into the anode side of the fuel cell stack 310. When it is necessary to obtain parameters of the active area of the anode side of each of the individual cells 20, the positive electrode of the high-precision constant current source 320 is connected to the negative electrode of the fuel cell stack 310, and the negative electrode of the high-precision constant current source 320 is connected to the positive electrode of the fuel cell stack 310. Nitrogen is supplied into the anode side of the fuel cell stack 310, and hydrogen is supplied into the cathode side of the fuel cell stack 310. Base on the parameters of the object to be obtained, different connection modes can be selected.

In an embodiment, the individual cells 20 in the fuel cell stack 310 are charged by different constant current values selected by the high precision constant current source 320 based on empirical values. In a process of charging the individual cells, the first voltage values of each of the individual cells 20 may be recorded by a high-precision fast sampling system. In an embodiment, the sampling interval of the high-precision fast sampling system is less than 0.01 s. When different constant current values are selected to charge the fuel cell stack 310, the intervals may be more than 1 minute, so as to ensure measurement accuracy.

In step S800, the second hydrogen leakage current value can be obtained by a polarization curve test method. This step may include preparation for test conditions, a data acquisition process, and a process of fitting the test data. During the preparation for the test conditions, air and hydrogen may be supplied into the cathode and anode of the fuel cell stack 310. The humidity of the air and the hydrogen can be maintained at 80% or more, to ensure that the reaction zone in the normal operating state can be sufficiently infiltrated. In the data acquisition process, taken as a controlling variable, the current density may be gradually increased from 0 mA/cm$^2$, and the second voltage values of each of the individual cells 20 may be recorded. In order to obtain a high-precision state parameter of the membrane electrode, the increasing interval of the current density can be accurately controlled. In an embodiment, the current density may be gradually increased at an increasing interval of 0.1 mA/cm$^2$ from 0 mA/cm$^2$ to 2 mA/cm$^2$. The fitting algorithm may be a least squares curve fitting method or the like.

In step S900, the more accurate corrected hydrogen leakage current value can be calculated and obtained according to the first hydrogen leakage current value and the second hydrogen leakage current value. The operating state of the membrane electrode may be more accurately reflected by the corrected hydrogen leakage current value.

According to the method for estimating the performance of the fuel cell membrane electrode provided in the embodiment of the disclosure, the first hydrogen leakage current value of the membrane electrode of the individual cell 20 is obtained according to the constant current values and the first voltage values; the second hydrogen leakage current value is obtained by a fitting algorithm based on the current density values and the second voltage values; a corrected hydrogen leakage current value is obtained on the basis of the first hydrogen leakage current value and the second hydrogen leakage current value. By correcting the first hydrogen leakage current value and the second hydrogen leakage current value obtained by means of different test methods, the hydrogen leakage current value is more accurate, and the operation state of the membrane electrode can be more accurately reflected.

In an embodiment, the step S900 includes:

S910, averaging the first hydrogen leakage current value and the second hydrogen leakage current value to obtain an initial hydrogen leakage current;

S920, obtaining a first active area value and a second active area value based on at least two of the constant current values, the initial hydrogen leakage current, and an active area calculation formula;

S930, averaging the first activity area value and the second activity area value to obtain an initial corrected activity area value; and

S940, obtaining a corrected hydrogen leakage current value based on the initial corrected active area value, at least two of the constant current values, and a hydrogen leakage current calculation formula.

In step S910, the initial hydrogen leakage current value $I_{loss,\,0}=(I_{loss,\,A}+I_{loss,\,B})/2$. Where $I_{loss,\,A}$ and $I_{loss,\,B}$ are the first hydrogen leakage current value and the second hydrogen leakage current value, respectively.

In step S920, the active area calculation formula is:

$$ECSA = \frac{\int_0^{\overline{V}}\left(\frac{I_{GA}-i_{loss,0}}{dV/dt}-C_{dl}\right)dV}{Q_{H,A}\cdot W_{pt}}\;[m^2 g^{-1}]$$

Where ECSA denotes the active area, $Q_{H,\,A}$ denotes the hydrogen adsorption amount per unit area, $W_{pt}$ denotes the platinum load amount per unit area, $I_{GA}$ denotes the constant current value, V denotes the first voltage value, and $C_{dl}$ denotes the double-layer capacitance. The first active area value $ECSA_1$ and the second active area value $ECSA_2$ can be obtained by substituting two different constant current values $I_{GA}$ into the active area calculation formula, respectively.

In step S930, the initial corrected active area value $ECSA_0$ is obtained by averaging the first active area value $ECSA_1$ and the second active area value $ECSA_2$.

In step S940, the hydrogen leakage current calculation formula is:

$$i_{loss} = \frac{\int_0^{\overline{V}}\left(\frac{I_{GA}}{dV/dt}-C_{dl}\right)dV - ECSA\times Q_{H,A}\times W_{pt}}{t_{I_{GA}}}$$

Where $t_{I_{GA}}$ denotes the charging time corresponding to the constant current value. The corrected hydrogen leakage current value can be obtained by substituting the initial corrected active area value and the at least two of the constant current values into the hydrogen leakage current calculation formula.

After step S940 completes, the step S920 may be repeated for data iterations, so as to further improve the accuracy of the corrected hydrogen leakage current value.

In an embodiment, in step S920, the at least two constant current values are at least two maximum current values of the plurality of constant current values. Since the large charging current is not too sensitive to the accuracy of the hydrogen leakage current, the error can be well reduced by cyclic iterations.

In an embodiment, in step S940, the at least two constant current values are at least two minimum current values of the plurality of constant current values. The small charging current is relatively sensitive to the accuracy of the hydrogen leakage current, so that the accuracy of the value of the corrected hydrogen leakage current can be improved.

In an embodiment, the step S940 further includes:

S950, obtaining at least two third active area values based on the corrected hydrogen leakage current value, the active area calculation formula, and at least two constant current values, and averaging the at least two third active area values to obtain a corrected active area value.

In step S950, the at least two constant current values may be at least two maximum constant current values. The at least two of the third active area values may be obtained by substituting at least two of the constant current values into the active area calculation formula, respectively. The corrected active area value may be obtained by averaging the at least two third active area values.

In an embodiment, after step S940, the method further includes:

step S950', obtaining a corrected internal resistance value and a corrected exchange current density value by the fitting algorithm based on the corrected hydrogen leakage current value. The corrected internal resistance value and the corrected exchange current density value may be obtained by substituting the test data into the following equation and fitting the test data.

$$I_{ls} = I_{loss,i}\cdot\frac{1}{1+\exp\left(\frac{V_{s0}-V}{K}\right)}$$

$$V = U_0 - R\cdot(I_{fc}+I_{ls}) - b\cdot\log\left(\frac{I_{fc}+I_{ls}}{i_0}\right);$$

Where V is the second voltage value, $I_{fc}$ is the current density value, $V_{s0}$ is a half potential constant, K is a constant, b is a tower slope, $U_0$ is a Nernst voltage, and $I_{ls}$ is the transverse translation current. Where R is the internal resistance of the individual cell 20, $I_{loss,\,i}$ is the hydrogen leakage current, and $i_0$ is the exchange current density, which are all unknowns, and the corrected internal resistance value R and the corrected exchange current density value $i_0$ can be obtained by substituting data the above formula and fitting the data.

In an embodiment, in step S700, before the selecting the plurality of constant current values for charging the fuel cell stack 310, the method further includes:

S710, supplying hydrogen to the anode and nitrogen to the cathode of the fuel cell stack 310; and

S720, supplying a constant temperature medium to the fuel cell stack 310 to make the fuel cell stack 310 maintain a temperature in a preset range. The preset range may be from 60° C. to 80° C. thereby ensuring the accuracy of a test.

In an embodiment, in step S710, a humidity of the hydrogen and the nitrogen is greater than 80%, thus ensuring that the reaction zone in all normal operating conditions is sufficiently infiltrated.

In an embodiment, before the step S800 of selecting a plurality of current density values as reaction discharge current density values of the fuel cell stack, the method further includes:

S810, supplying hydrogen to the anode and air to the cathode of the fuel cell stack 310; and S820, supplying a constant temperature medium to the fuel cell stack 310 to make the fuel cell stack 310 maintain the temperature in a preset range. The preset range may be from 60° C. to 80° C., thereby ensuring the accuracy of the test.

In an embodiment, in step S700, the obtaining the first hydrogen leakage current value of the membrane electrode of each of the individual cells 20 based on the constant current values and the first voltage values includes:

differentiating a change process of the first voltage value corresponding to at least two constant current values with respect to time to obtain a voltage differential, and obtaining the second hydrogen leakage current value based on a voltage differential formula.

Figure 18:
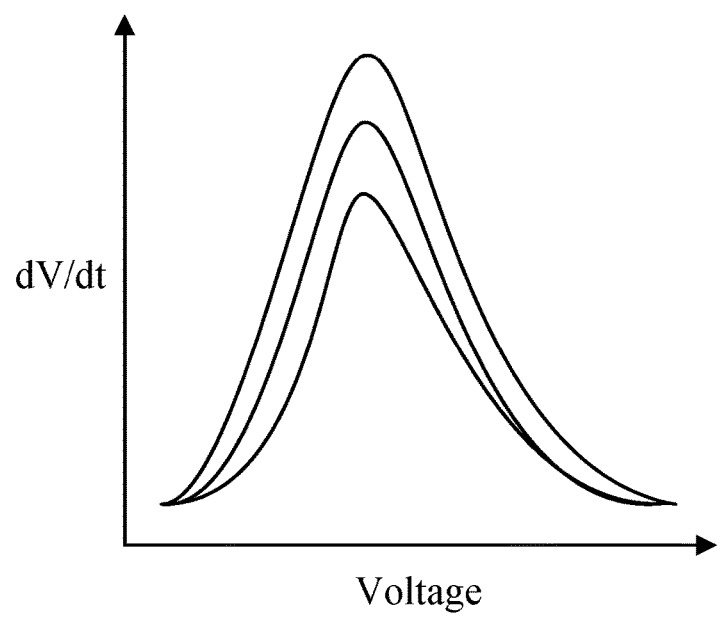
FIG. 18 is a schematic diagram illustrating a voltage differential coordinate according to an embodiment of the present disclosure.

Referring to FIG. 18, in an embodiment, the first voltage values are processed according to dV/dt to obtain a result corresponding to each of the constant current values. Where the highest point of dV/dt generally occurs at a position of the determined voltage position.

On the basis of the dV/dt value of the highest point of each constant-current charging result and the constant current value $I_{GA}$, the double layer capacitance $C_{dl}$ and the first hydrogen leakage current value $i_{loss, A}$ of each individual cell 20 can be obtained by integrating the following equations.

$$\begin{cases} I_{GA}|_1 = C_{dl} \dfrac{dV}{dt}\bigg|_1 + i_{loss,A} \\ I_{GA}|_2 = C_{dl} \dfrac{dV}{dt}\bigg|_2 + i_{loss,A} \\ \ldots \\ I_{GA}|_n = C_{dl} \dfrac{dV}{dt}\bigg|_n + i_{loss,A} \end{cases}$$

In an embodiment, the active area ECSA can be calculated by the active area calculation formula based on the electric double-layer capacitance $C_{dl}$ and the first hydrogen leakage current value $i_{loss, A}$.

Figure 19:
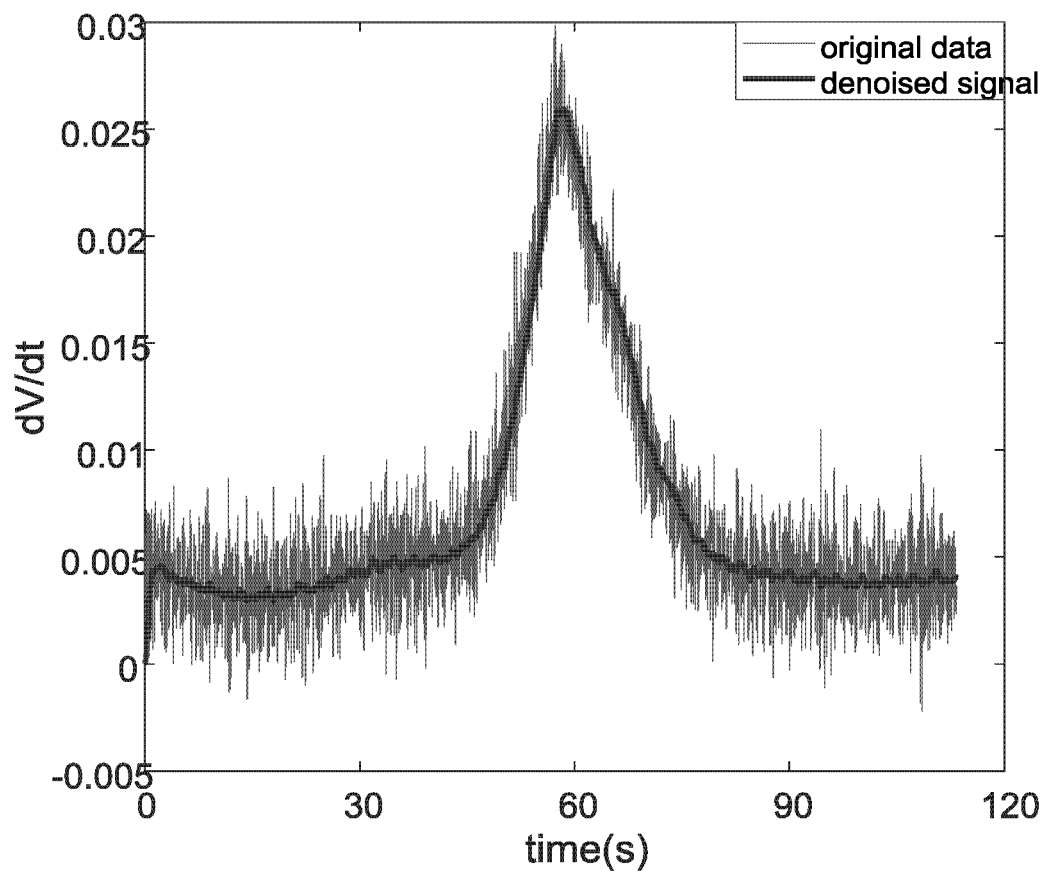
FIG. 19 is a schematic diagram illustrating a noise reduction effect according to an embodiment of the present disclosure.

Referring to FIG. 19, in an embodiment, after the differentiating the change process of the first voltage values corresponding to the at least two constant currents with respect to time, a noise reduction processing is performed on the voltage differential formula. It has been found that during calculation of the dV/dt, the noise of the dV/dt is very large due to a small amplitude of variation. In order to reduce the noise, a filter can be used to process the data.

The above-described examples represent only a few embodiments of the present disclosure, and the description is more specific and detailed, but is not therefore construed as limiting the scope of the patent. It should be noted that several variations and modifications may be made by those of ordinary skill in the art without departing from the conception of the present disclosure. These variations and modifications are all within the protection scope of the present disclosure. Accordingly, the scope of protection of the present patent should be subject to by the appended claims.

What is claimed is:

1. A method for diagnosing degradation of a fuel cell stack, comprising:
   S10, determining a degradation type of the fuel cell stack according to a voltage-current curve of the fuel cell stack, comprising:
      determining that the degradation type of the fuel cell stack is an activation overpotential increase if a voltage of a current voltage-current curve of the fuel cell stack, compared with that of an initial voltage-current curve of the fuel cell stack, decreases and makes a downwards translation within an entire operating current range;
      determining that the degradation type of the fuel cell stack is a concentration difference overpotential increase if a voltage drop of a current voltage-current curve of the fuel cell stack relative to an initial voltage-current curve of the fuel cell stack increasingly accelerates with increasing current density; and
      determining that the degradation type of the fuel cell stack is an ohmic overpotential increase if a voltage drop of the voltage-current curve of the fuel cell stack relative to an initial voltage-current curve of the fuel cell stack linearly accelerates with increasing current density;
   S20, measuring parameter values of each of individual cells of the fuel cell stack according to the degradation type, and determining a degradation degree of each of the individual cells according to the parameter values, wherein:
      the parameter values comprise an internal resistance value, an active area value, a hydrogen leakage current value, and a double-layer capacitance value;
      the active area value, the hydrogen leakage current value, and the double-layer capacitance value of the individual cell are obtained by a constant current method; and
      the obtaining the active area value, the hydrogen leakage current value, and the electric double layer capacitance value of the individual cell by the constant current method comprises:
         S210, supplying hydrogen to an anode of the fuel cell stack, and supplying nitrogen to a cathode of the fuel cell stack;
         S220, supplying, by a constant current source, a constant charging current to the fuel cell stack through, and recording a voltage value of the individual cell;
         S230, obtaining the hydrogen leakage current value and the double-layer capacitance value of the individual cell based on the voltage value, a derivative of the voltage with respect to time, and the charging current; and
         S240, obtaining the active area value based on the charging current, the hydrogen leakage current value, the voltage value, a hydrogen adsorption amount per unit area of a catalyst surface of the individual cell, and a catalyst loading amount per unit area of the individual cell;
   S310, detecting a plurality of voltage values on each of the individual cells of the fuel cell stack;
   S320, obtaining potential differences between different positions on bipolar plates between the individual cells based on the voltage values;

S330, determining current distributions on the bipolar plates based on the potential differences; and S340, determining a uniformity degradation position and a degradation degree of the individual cells.

2. The method for diagnosing degradation of the fuel cell stack according to claim 1, wherein the internal resistance value of the individual cell is obtained by an alternating-current impedance method.

3. The method for diagnosing degradation of the fuel cell stack according to claim 2, wherein the internal resistance value of the individual cell is obtained by a high-frequency impedance value.

4. The method for diagnosing degradation of the fuel cell stack according to claim 1, wherein the internal resistance value of the individual cell is measured by a current interruption method.

5. The method for diagnosing degradation of the fuel cell stack according to claim 1, wherein, step S230 is performed after a duration of step S220 of supplying the hydrogen to the anode and the nitrogen to the cathode reaches a preset period of time.

6. The method for diagnosing degradation of the fuel cell stack according to claim 5, wherein the preset period of time is 1 to 2 hours.

7. The method for diagnosing degradation of the fuel cell stack according to claim 1, wherein in step S240, the active area value is obtained by:

$$ECSA = \frac{\int_0^{\mathcal{V}} \left( \frac{I_{GA} - i_{H_2}}{dV/dt} - C_{dl} \right) dV}{Q_{H,A} \cdot W_{pt}} \; [m^2 g^{-1}]$$

wherein $I_{GA}$ denotes the charging current, $i_{H_2}$ denotes the hydrogen leakage current, V denotes the power supply value, $Q_{H,A}$ denotes the hydrogen adsorption amount per unit area of the catalyst surface of the individual cell, and Wp denotes the catalyst loading amount per unit area of the individual cell.

8. The method for diagnosing degradation of the fuel cell stack according to claim 1, wherein in step S220, a magnitude of the charging current is changed several times, and several sets of voltage values of the individual cells are recorded.

9. The method for diagnosing degradation of the fuel cell stack according to claim 1, wherein in step S20, the measuring the parameter values of each of the individual cells of the fuel cell stack, and the determining the degradation degree of each of the individual cells according to the parameter values comprise:

S211, obtaining an ohmic overpotential change of the individual cell according to a change of the internal resistance value and a discharge current during operation of the fuel cell stack;

S221, obtaining an activation overpotential change of the individual cell from a change of the active area value in two measurements;

S231, obtaining a concentration difference overpotential change based on a degraded voltage value of the individual cell, the activation overpotential change, and the ohmic overpotential change; and S241, determining the degradation degree of the individual cell based on the ohmic overpotential change, the activation overpotential change, and the concentration difference overpotential change.

10. The method for diagnosing degradation of the fuel cell stack according to claim 9, wherein in the S211, the ohmic overpotential change is $\Delta U_{celli,\,ohmic} = i \times \Delta R_{celli}$, wherein $\Delta R_{celli}$ denotes a difference between an internal resistance value in an initial measurement and the internal resistance value in a current measurement, that is, a change of the internal resistance value, and i denotes a discharge current during operation of the fuel cell stack.

11. The method for diagnosing degradation of the fuel cell stack according to claim 1, wherein in step S30, a specific functional degradation position of the individual cells is determined by a voltage patrol detection method.

12. The method for diagnosing degradation of the fuel cell stack according to claim 1, wherein in step S310, plural sets of voltage patrol detections are arranged along a flow channel direction of each of the individual cells, and the plurality of voltage values are obtained by the plural sets of voltage patrol detections.

13. The method for diagnosing degradation of the fuel cell stack according to claim 1, wherein in step S10, the degradation type of the fuel cell stack is determined by an AC impedance spectroscopy.

\* \* \* \* \*